(12) United States Patent
Katscher et al.

(10) Patent No.: US 7,403,005 B2
(45) Date of Patent: Jul. 22, 2008

(54) REGULARIZED VARIABLE DENSITY SENSE

(75) Inventors: Ulrich Katscher, Norderstedt (DE); Johan Van Den Brink, Deil (NL); Miha Fuderer, Eindhoven (NL)

(73) Assignee: Koninklijke Philips Electronics, N.V., Eindhoven (NL)

( * ) Notice: Subject to any disclaimer, the term of this patent is extended or adjusted under 35 U.S.C. 154(b) by 51 days.

(21) Appl. No.: 10/597,060
(22) PCT Filed: Jan. 5, 2005
(86) PCT No.: PCT/IB2005/050051
§ 371 (c)(1), (2), (4) Date: Jul. 10, 2006
(87) PCT Pub. No.: WO2005/069031
PCT Pub. Date: Jul. 28, 2005

(65) Prior Publication Data
US 2007/0182412 A1   Aug. 9, 2007

Related U.S. Application Data

(60) Provisional application No. 60/536,399, filed on Jan. 14, 2004.

(51) Int. Cl.
*G01V 3/00* (2006.01)
(52) U.S. Cl. ........................ 324/309; 324/307
(58) Field of Classification Search ................ 324/309, 324/307, 306
See application file for complete search history.

(56) References Cited

U.S. PATENT DOCUMENTS

| | | | |
|---|---|---|---|
| 6,353,752 B1 | 3/2002 | Madore et al. | |
| 6,380,741 B1 | 4/2002 | Hajnal et al. | |
| 6,487,435 B2 | 11/2002 | Mistretta et al. | |
| 6,518,760 B2 | 2/2003 | Fuderer et al. | |
| 6,556,009 B2* | 4/2003 | Kellman et al. | 324/309 |
| 6,903,551 B2* | 6/2005 | Madore | 324/309 |
| 2002/0014889 A1 | 2/2002 | Pruessmann et al. | |
| 2002/0060567 A1 | 5/2002 | Harvey et al. | |
| 2002/0074999 A1 | 6/2002 | Katscher et al. | |
| 2002/0171422 A1 | 11/2002 | King | |
| 2002/0175683 A1 | 11/2002 | Mertelmeier et al. | |

FOREIGN PATENT DOCUMENTS

WO   WO 03093854 A1   11/2003

OTHER PUBLICATIONS

Katscher, U., et al.; Underdetermined SENSE using a-priori knowledge; 2002; Proc. Intl. Soc. Mag. Reson. Med. 10; pp. 2396.

(Continued)

*Primary Examiner*—Louis M Arana

(57) ABSTRACT

A magnetic resonance imaging apparatus includes a plurality of radio frequency coils (34) that acquire variable density sensitivity encoded data that is undersampled at least away from the center of k-space. A reconstruction processor (52) for each coil reconstructs: a regularization image reconstructed from a higher density portion of the variable density sensitivity encoded data disposed at or near a center of k-space acquired by that coil; and a folded image reconstructed from the variable density sensitivity encoded data acquired by that coil. An unfolding processor (66) unfolds the folded images. The unfolding is regularized by the regularization images.

16 Claims, 3 Drawing Sheets

OTHER PUBLICATIONS

Figure 1:
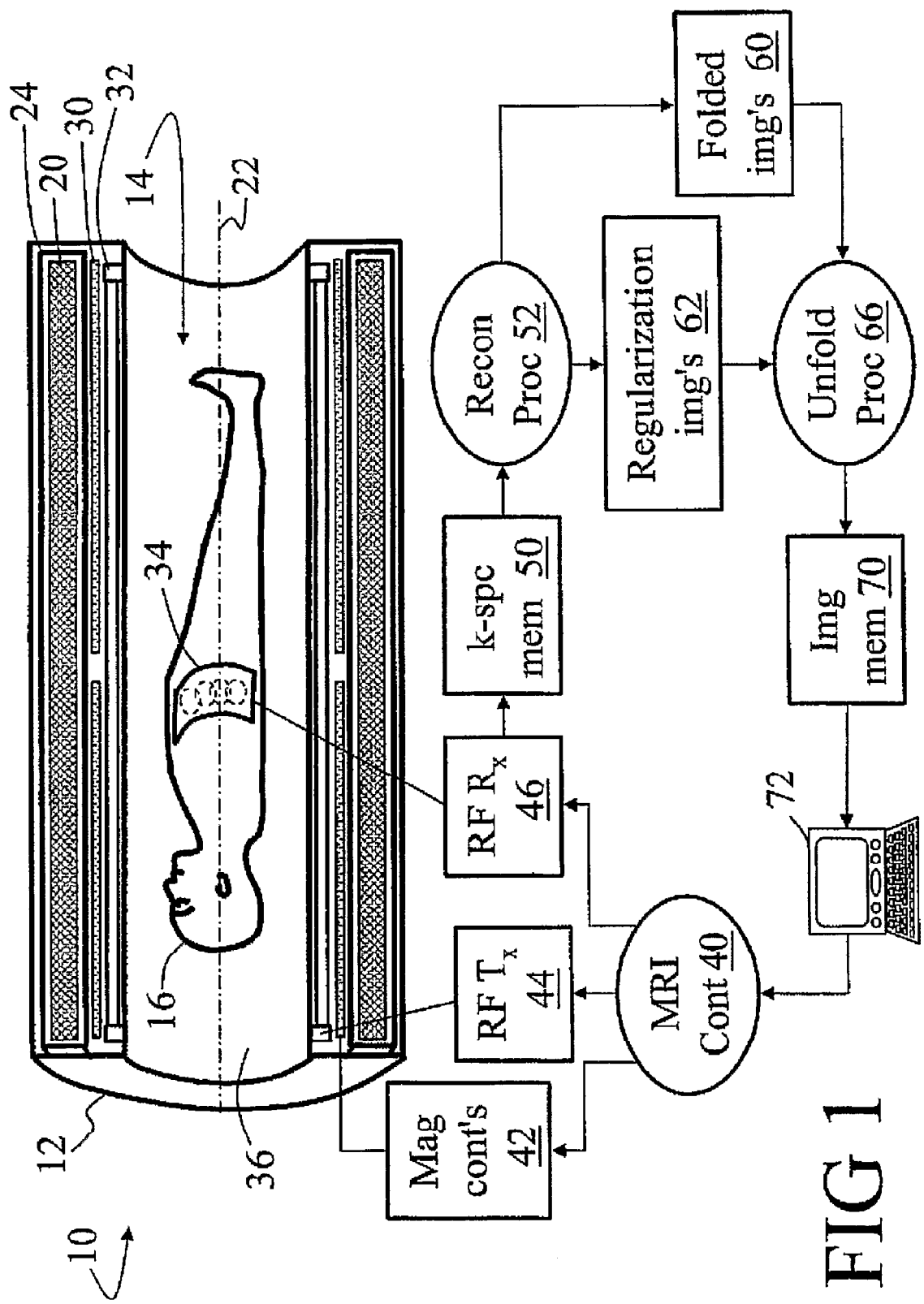

Katscher, U., Underdetermined variable density SENSE; 2003; Proc. Intl. Soc. Mag. Reson. Med. 11; pp. 2342.

Kyriakos, W.E., et al.; Sensitivity Profiles From an Array of Coils for Encoding and Reconstruction in Parallel (Space Rip); 2000; Mag. Res. in Med.; 44:301-308.

Mckenzie, C.A., et al.; Self-Calibrating Parallel Imaging with Automatic Coil Sensitivity Extraction; 2002; Mag. Reson. in Med.; 47:529-538.

Pruessmann, K.P., et al.; Advances in Sensitivity Encoding with Arbitrary k-Space Trajectories; 2001; Mag. Reson. in Med., 46:638-651.

Pruessmann, K.P., et al.; SENSE: Sensitivity Encoding for Fast MRI; 1999; Mag. Reson. in Med.; 42:952-962.

Tsao, J., et al.; MR angiography at high acceleration using feedback regularized SENSE and variable density k-space sampling; 2003; Proc. Intl. Soc. Mag. Reson. Med.; 11:484.

Yeh, E. N., et al.; Self-Calibrated Spiral Parallel Imaging; 2002; Proc. Intl. Soc. Mag. Reson. Med.; 10.

* cited by examiner

REGULARIZED VARIABLE DENSITY SENSE

CROSS REFERENCE TO RELATED APPLICATIONS

This application claims the benefit of U.S. provisional application serial no. 60/536,399 filed Jan. 14, 2004, which is incorporated herein by reference.

The following relates to the magnetic resonance arts. It finds particular application in magnetic resonance imaging employing non-Cartesian sampling of k-space, and in magnetic resonance imaging employing variable density sensitivity encoding (SENSE), and will be described with particular reference thereto. However, it also finds application in other magnetic resonance applications such as magnetic resonance spectroscopy.

In the SENSE magnetic resonance imaging technique, a plurality of coils are used to simultaneously acquire magnetic resonance imaging data of a common imaging slice or volume. To acquire imaging data quickly using the SENSE technique, each coil undersamples k-space. The undersampled imaging data acquired by each coil are reconstructed into corresponding folded images of the slice or volume. The folded images are unfolded based on sensitivity characteristics of the coils to produce an unfolded image of the slice or volume. The SENSE imaging technique is described, for example, in Pruessmann et al., Magnetic Resonance in Medicine 42, pp. 952-962 (1999) and in Hajnal et al., U.S. Pat. No. 6,380,741.

In conventional SENSE imaging, k-space is uniformly sampled. In variable density SENSE, the sampling is not uniform; rather, fewer k-space samples are skipped at or near a center of k-space while more k-space samples are skipped away from the center of k-space. As with conventional SENSE, the undersampled imaging data acquired by each coil is reconstructed into corresponding folded images. The folded images are unfolded using a suitable unfolding algorithm, such as by solving the matrix equation:

$$m(k_y)=S(r_y,k_y)p(r_y) \quad (1),$$

where $k_y$ indexes the Fourier encoding steps, $r_y$ indexes unfolded image position, $m(k_y)$ contains folded image data, $p(r_y)$ corresponds to the unfolded image, and $S(r_y,k_y)$ corresponds to a sensitivities matrix that contains the sensitivities of the coils along the column and the corresponding Fourier encoding steps. The unfolded image term p contains N true pixel values of the unfolded image. The folded images term m contains CN/R measured values where C is the number of coils and R is a time reduction factor corresponding to the undersampling. Equation (1) is solved for $p(r_y)$ to compute the unfolded image.

To acquire imaging data quickly using the variable density SENSE technique, the undersampling is increased. However, if the k-space sampling is too sparse, Equation (1) becomes underdetermined or close to singular. This leads to computational difficulties and can produce artifacts in the unfolded image. To address this problem, the unfolding can be regularized using a priori knowledge. Regularization depends upon the nature and quality of the a priori knowledge. Typically, this additional information is provided by acquiring additional magnetic resonance signal information which is combined with the variable density SENSE data during the unfolding.

In spite of such regularization techniques, the processing of undersampled variable density SENSE imaging data to efficiently produce an unfolded image with reduced artifacts remains a challenging problem. Image quality improvement gained by including the a priori knowledge may be offset by longer imaging sessions needed to acquire the a priori knowledge. Moreover, subject motion or other changes occurring between acquisition of the a priori knowledge content and the variable density SENSE data may cause a spatial misregistration or other mismatch between the a priori knowledge and the folded images.

The present invention contemplates an improved apparatus and method that overcomes the aforementioned limitations and others.

According to one aspect, a magnetic resonance imaging method is provided. Variable density sensitivity encoded data is acquired with a higher density at and adjacent a center of k-space and with a lower, undersampled density away from the center of k-space. One or more regularization images are constructed from the higher density portion of the variable density sensitivity encoded data disposed at and adjacent the center of k-space. The variable density sensitivity encoded data are reconstructed into an unfolded reconstructed image. The reconstructing includes: reconstructing the higher and lower density variable density sensitivity encoded data into a plurality of folded images; and unfolding the folded images to form the unfolded image using the one or more regularization images.

According to another aspect, a magnetic resonance imaging apparatus is disclosed. A plurality of radio frequency coils acquire variable density sensitivity encoded data that is undersampled at least away from the center of k-space. A reconstruction processor for each coil reconstructs: a regularization image reconstructed from a higher density portion of the variable density sensitivity encoded data disposed at or near a center of k-space acquired by that coil; and a folded image reconstructed from the variable density sensitivity encoded data acquired by that coil. An unfolding processor unfolds the folded images. The unfolding is regularized by the regularization images.

One advantage resides in reconstructing undersampled variable density SENSE imaging data with improved speed.

Another advantage resides in reconstructing undersampled variable density SENSE imaging data with minimal artifacts.

Yet another advantage resides in an ability to process undersampled variable density SENSE imaging data acquired with a variety of k-space sampling trajectories such as radial or spiral sampling.

Numerous additional advantages and benefits will become apparent to those of ordinary skill in the art upon reading the following detailed description of the preferred embodiments.

The invention may take form in various components and arrangements of components, and in various process operations and arrangements of process operations. The drawings are only for the purpose of illustrating preferred embodiments and are not to be construed as limiting the invention.

FIG. 1 diagrammatically shows a magnetic resonance imaging system implementing the variable density SENSE magnetic resonance imaging described herein. In FIG. 1, the magnetic resonance imaging scanner is illustrated with about one-half of the scanner cut away to reveal internal components of the scanner and to reveal an associated imaging subject and SENSE coil array disposed in the scanner bore.

Figure 2:
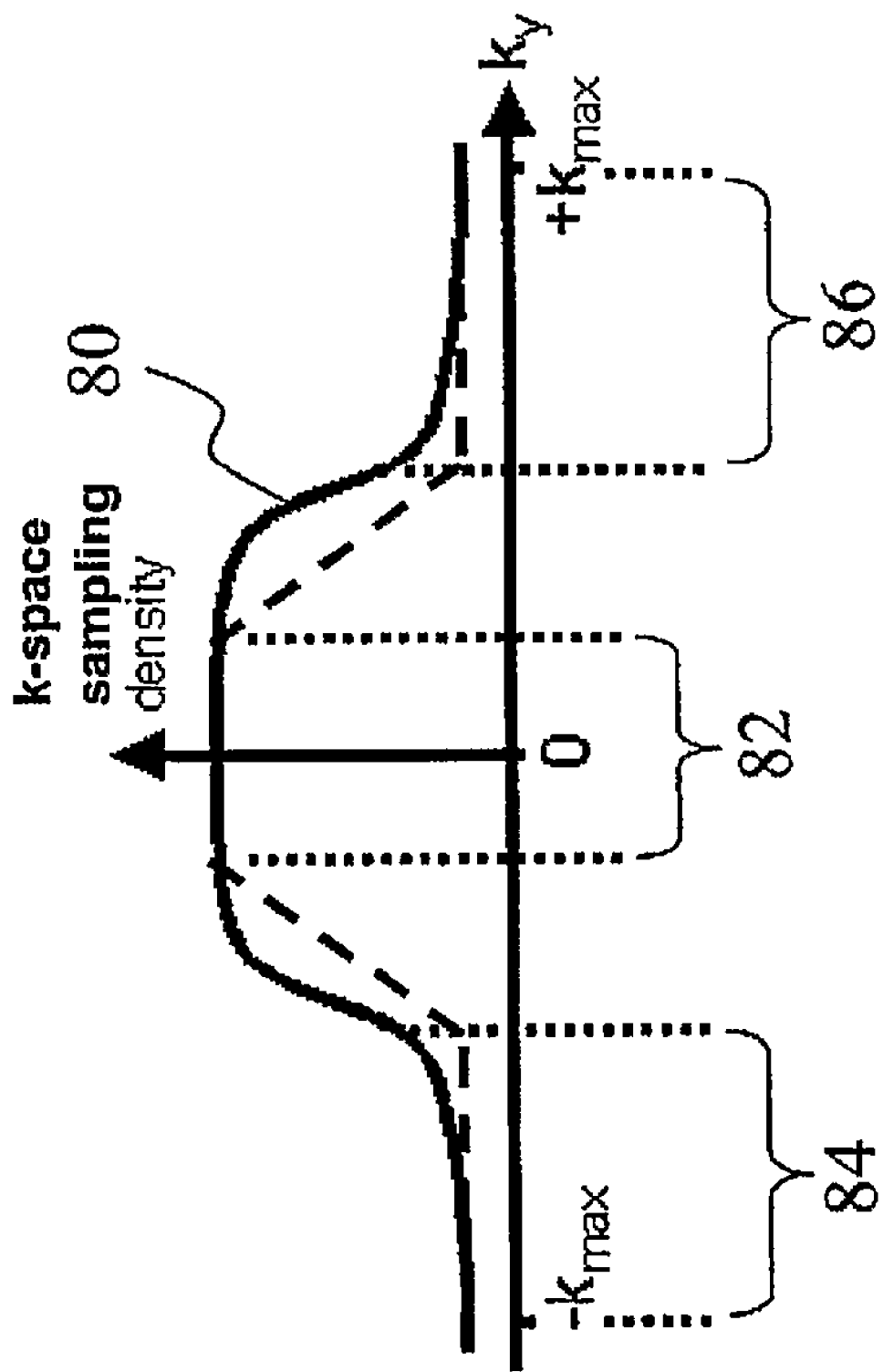

FIG. 2 plots an example k-space sampling density profile for variable density SENSE imaging.

Figure 3:
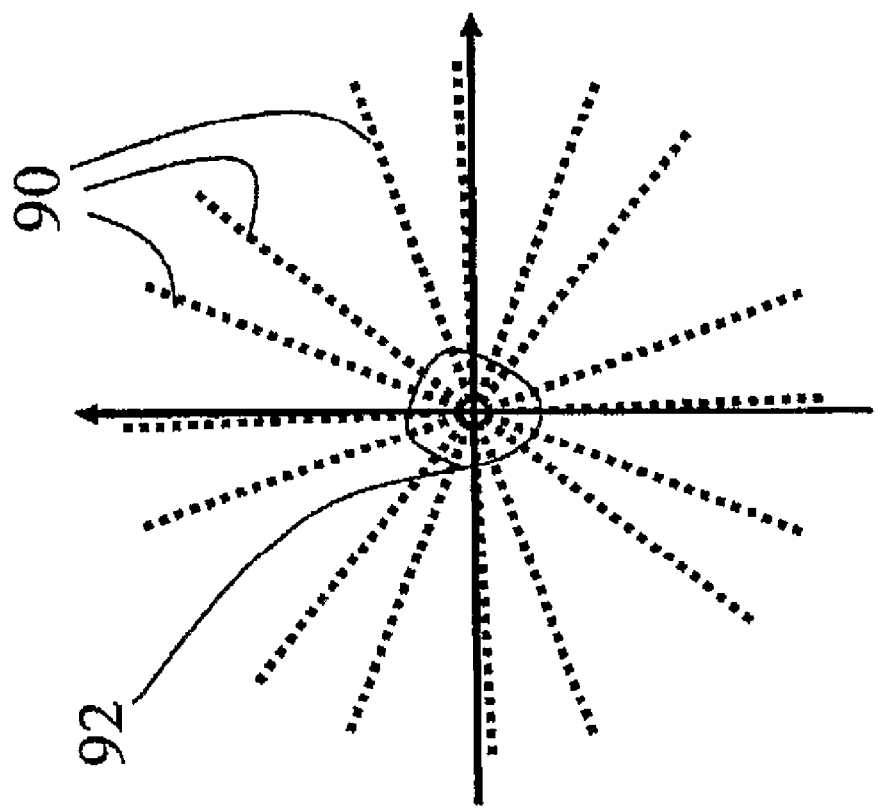

FIG. 3 diagrammatically shows radial k-space sampling trajectories for variable density SENSE imaging.

Figure 4:
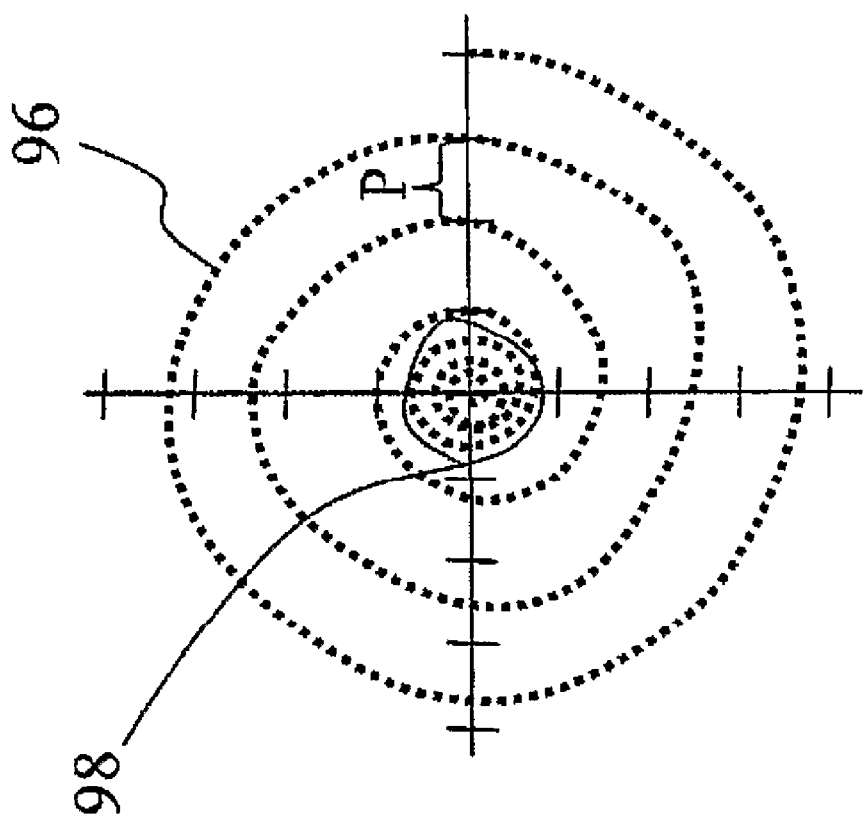

FIG. 4 diagrammatically shows a spiral k-space trajectory for variable density SENSE imaging.

With reference to FIG. 1, a magnetic resonance imaging scanner 10 includes a housing 12 defining a generally cylindrical scanner bore 14 inside of which an associated imaging subject 16 is disposed. Main magnetic field coils 20 are disposed inside the housing 12. The main magnetic field coils 20 are arranged in a generally solenoidal configuration to produce a main $B_o$ magnetic field directed along a central axis 22 of the scanner bore 14. The main magnetic field coils 20 are typically superconducting coils disposed inside in cryoshrouding 24, although resistive main magnets can also be used. Moreover, the scanner 10 may include additional access openings other than the ends of the cylindrical scanner bore 14 for accessing the imaging subject 16. For example, rather than a closed solenoidal configuration having a closed generally "O"-shaped cross-section, a more open generally "U"-shaped cross-sectional magnet can be employed.

The housing 12 also houses or supports magnetic field gradient coils 30 for selectively producing magnetic field gradients parallel to the central axis 22 of the bore 14, along in-plane directions transverse to the central axis 22, or along other selected directions. Optionally, the housing 12 further houses or supports a birdcage radio frequency body coil 32 for selectively exciting and/or detecting magnetic resonances. A sensitivity encoding (SENSE) coil array 34 disposed inside the bore 14 includes a plurality of SENSE coils, specifically four SENSE coils in the example coil array 34, although other numbers of coils can be used. The coils of the coil array 34 have different sensitivities to the magnetic resonance signal, thus enabling SENSE encoding. In one embodiment, the coil array 34 is an array of surface coils disposed close to the imaging subject 16. Rather than a coil array, other radio frequency antennae that have a suitable spatial sensitivity profile can be used for acquiring the SENSE data, such as antennae defined by porting the received radio frequency signal from a plurality of spatially separated ports of a radio frequency coil.

The SENSE coil array 34 can be used for receiving magnetic resonances that are excited by the optional birdcage or other whole body coil 32, or the magnetic resonances can be both excited and received by the SENSE coil array 34. The housing 12 typically includes a cosmetic inner liner 36 defining the scanner bore 14.

The main magnetic field coils 20 produce a main magnetic field $B_o$. A magnetic resonance imaging controller 40 operates magnet controllers 42 to selectively energize the magnetic field gradient coils 30, and operates a radio frequency transmitter 44 coupled to the radio frequency coil 32 as shown, or coupled to the SENSE coil array 34, to selectively energize the radio frequency coil or coil array 32, 34. By selectively operating the magnetic field gradient coils 30 and the radio frequency coil or coil array 32, 34 magnetic resonance is generated and spatially encoded in at least a portion of a selected region of interest of the imaging subject 16. By applying selected magnetic field gradients via the gradient coils 30, a selected k-space trajectory is traversed, such as a Cartesian trajectory, a plurality of radial trajectories, or a spiral trajectory. During traversal of the selected k-space trajectory, the magnetic resonance imaging controller 40 operates a radio frequency receiver 46 coupled to the SENSE coil array 34 to read out k-space samples using the coils of the SENSE coil array 34. The k-space samples are stored in a k-space memory 50.

The stored k-space samples are sorted by the receive coil of the array which received each sample. The k-space sampling is variable, with higher density k-space sampling at or near a center of k-space, and an undersampled lower density k-space sampling away from the center of k-space. A reconstruction processor 52 reconstructs the undersampled k-space data spanning all of k-space acquired by each coil into corresponding folded images that are stored in a folded images memory or buffer 60. Additionally, the portion of k-space at or near k-space center acquired by each coil at a higher sampling density is reconstructed by the reconstruction processor 52 into corresponding low resolution regularization images that are stored in a regularization images memory or buffer 62.

An unfolding processor 66 unfolds the folded images 60 using an unfolding algorithm that is regularized by the regularization images 62. In one suitable approach, the folded images 60 are unfolded by minimizing an error parameter δ:

$$\delta^2 = \|m(k) - S(r_y, k_y) p(r_y)\|^2 + q^2 \|I_{reg}(r_y)\|^2 \quad (2),$$

where $k_y$ indexes the Fourier encoding steps, $r_y$ corresponds to the image position at index y, $m(k_y)$ corresponds to the folded images, $p(r_y)$ corresponds to the unfolded image, $S(r_y, k_y)$ corresponds to a sensitivities matrix that contains the sensitivities of the coils along the column and the corresponding Fourier encoding steps, and $I_{reg}(r_y)$ corresponds to a regularization image constructed from low resolution images stored in the regularization images memory 62. The unfolded image term p contains N true pixel values of the unfolded image. The folded images term m contains CN/R measured values where C is the number of coils and R is a time reduction factor corresponding to the undersampling.

In one embodiment, the regularization image $I_{reg}(r_y)$ is constructed by combining the low resolution regularization images acquired by the various receive coils. The low resolution regularization images can be combined using a sum-of-squares process to produce a composite image. In another embodiment, a single low resolution regularization image acquired by one of the receive coils is used as the regularization image. In this embodiment, the selected image was preferably acquired by a receive coil that has a largely uniform sensitivity over the field of view.

The operator $\|x\|$ in Equation (2) denotes the Euclidean norm of x. Equation (2) includes unfolding term $\|m(k_y) - S(r_y, k_y)p(r_y)\|^2$ that is indicative of fidelity of the unfolded image to the folded images, and regularization term $\|I_{reg}(r_y) - p(r_y)\|^2$ that is indicative of fidelity of the unfolded image to the one or more regularization images 62. The parameter q is a regularization weighting parameter determining the relative influences of the unfolding term and the regularization term. It will be recognized that if q=0 then unregularized Equation (1) is recovered.

In one approach for evaluating Equation (2) to obtain the unfolded image, the unfolding processor 66 minimizes Equation (2) with respect to the unfolded image term $p(r_y)$. This minimization is preferably done analytically according to:

$$p = I_{reg} + S^H (SS^H + q^2)^{-1} (m - SI_{reg}) \quad (3),$$

where the superscript "H" denotes the transposed complex conjugate of S, the functional dependencies on $k_y$ and $r_y$ indicated in Equation (2) have been omitted. Equation (3) can be further optimized with respect to the regularization weighting parameter q, for example by performing a least squares minimization of the image term p of Equation (3) with respect to regularization weighting parameter q.

The unfolded image is stored in an image memory 70, and can be displayed on a user interface 72, stored in non-volatile memory, transmitted over a local intranet or the Internet, viewed, stored, manipulated, or so forth. The user interface 72 can also enable a radiologist, technician, or other operator of the magnetic resonance imaging scanner 10 to communicate with the magnetic resonance imaging controller 40 to select, modify, and execute magnetic resonance imaging sequences.

With reference to FIG. 2, a suitable variable density SENSE k-space sampling profile 80 for each coil is illustrated. The sampling density 80 includes a higher-density portion 82 disposed at or near k-space center which is constant and is not undersampled. This not undersampled higher density k-space portion 82 is reconstructed into a regularization image that includes no folding. Due to the limited k-space range of the k-space portion 82, the resulting regularization images 62 are low resolution images of the field of view.

The k-space sampling profile 80 also includes undersampled portions 84, 86 disposed away from k-space center and extending to $-k_{max}$ and $k_{max}$, respectively. In one embodiment, the not undersampled k-space portion 82 spans about one-eighth of the k-space range $[-k_{max}, k_{max}]$ of the variable density SENSE sampling profile 80. This one-eighth ratio provides good regularization images while still providing a substantial improvement in data acquisition speed. However, other ratios between the central, not undersampled k-space portion 80 and the total k-space range $[-k_{max}, k_{max}]$ of the SENSE sampling profile 80 are also suitable. The portion 82 is at least not undersampled, and is optionally oversampled to provide redundant data. Moreover, if oversampling of the portion 82 is performed, the oversampling optionally includes a non-constant sampling density over some or all of the portion 82.

The k-space sampling profile 80 includes a generally Gaussian sampling density transition between the not undersampled central k-space portion 82 and each of the undersampled outer portions 84, 86. Other sampling density transitions can also be used, however, such as a linear transition indicated in FIG. 2 by dashed lines.

In the above-described embodiment, a Cartesian k-space sampling trajectory is used, in which phase-encoded lines are read out, and the central (near k=0) lines are fully sampled and the more peripheral phase encoding lines are spaced apart in accordance with the selected variable density SENSE undersampling. In another embodiment, two-dimensional SENSE is used, in which the second dimension is typically transverse to the x-y plane. In yet another embodiment, a Cartesian k-space sampling trajectory is used, but the variable density SENSE undersampling is performed in the readout direction rather than in the phase encoding direction. In this embodiment, the parameters $k_y$ and $r_y$ in Equation (2) are suitably replaced by $k_x$ and $r_x$ corresponding to the readout direction. In yet another Cartesian k-space sampling trajectory, SENSE undersampling is performed in both the phase encode and readout directions.

With reference to FIG. 3, in another embodiment radial sampling trajectories 90 are employed. The radial sampling trajectories 90 converge at or near the center of k-space. This geometry of the radial sampling trajectories 90 provides a higher sampling density region 92 near the center of k-space center due to the convergence of the radial sampling trajectories 90. The higher sampling density region 92 is preferably oversampled or at least not undersampled for each coil, and the higher sampling density region 92 of the imaging data acquired by each coil is suitably reconstructed to form the regularization images 62. While FIG. 3 shows planar radial sampling trajectories 90, it is also contemplated to employ radial sampling trajectories three-dimensionally, spanning a hemispherical or full spherical solid angle.

With reference to FIG. 4, in yet another embodiment a spiral sampling trajectory 96 that spirals away from or into k-space center is employed. The illustrated spiral trajectory 96 preferably has a constant pitch P; however, an expanding or contracting pitch that changes with distance away from k-space center can also be used. The spiral can be in two or three dimensions. In three dimensions, it can spiral continuously, lie on the surface of concentric spheres, or the like. Also, the spiral can include a plurality of linear segments defining a generally square spiral, hexagonal spiral, dodecagonal spiral, or the like. The constant or increasing spiral pitch geometry provides a higher sampling density region 98 in the vicinity of k-space center. The higher sampling density region 98 is oversampled or at least not undersampled for each coil, and the higher sampling density region 98 of the imaging data acquired by each coil is suitably reconstructed to form the regularization images 62. Other sampling schemes with higher central k-space sampling densities are also contemplated.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having described the preferred embodiments, the invention is now claimed to be:

1. A magnetic resonance imaging method comprising:
   acquiring variable density sensitivity encoded data with a higher density at and adjacent a center of k-space and with a lower, undersampled density away from the center of k-space, the higher density portion disposed at or near the center of k-space not being undersampled;
   constructing one or more regularization images from the higher density portion of the variable density sensitivity encoded data disposed at and adjacent the center of k-space, the constructing not including unfolding of folded images; and
   reconstructing the variable density sensitivity encoded data into an unfolded reconstructed image, the reconstructing including:
   reconstructing the higher and lower density variable density sensitivity encoded data into a plurality of folded images, and
   unfolding the folded images to form the unfolded image using the one or more regularization images.

2. The magnetic resonance imaging method as set forth in claim 1, wherein the plurality of folded images are each acquired by a corresponding antenna of a plurality of antennae, and the constructing of one or more regularization images includes:
   reconstructing a low resolution image from the higher density portion of the variable density sensitivity encoded data acquired by each antenna that is not undersampled; and
   combining the reconstructed low resolution images to obtain the regularization image used in the unfolding.

3. The magnetic resonance imaging method as set forth in claim 1, wherein the higher density portion of the variable density sensitivity encoded data that is not undersampled spans about one-eighth of a k-space range of the variable density sensitivity encoded data.

4. The magnetic resonance imaging method as set forth in claim 1, wherein the higher density portion of the variable density sensitivity encoded data acquired by each antenna is oversampled and contains redundant data.

5. The magnetic resonance imaging method as set forth in claim 1, wherein the sensitivity encoded image unfolding includes:

optimizing a penalty function including a weighted combination of:
an unfolding term indicative of fidelity of the unfolded image to the folded images, and
a regularization term indicative of fidelity of the unfolded image to the regularization images.

6. The magnetic resonance imaging method as set forth in claim 1, wherein the acquiring of variable density sensitivity encoded data includes:
acquiring the higher density portion disposed at or near the center of k-space with a uniform k-space sampling density that is not undersampled; and
acquiring undersampled k-space data away from the center of k-space using a k-space sampling density that decreases smoothly with distance away firm the higher density portion.

7. The magnetic resonance imaging method as set forth in claim 6, wherein the sampling density transition between the higher density portion and the undersampled k-space data away from the center of k-space has one of a linear and a Gaussian shape.

8. A magnetic resonance imaging method comprising:
acquiring variable density sensitivity encoded data with a higher density at and adjacent a center of k-space and with a lower, undersampled density away from the center of k-space using a non-Cartesian trajectory, the higher density portion of the variable density sensitivity encoded data being defined by a geometry of the non-Cartesian trajectory;
constructing one or more regularization images from the higher density potion of the variable density sensitivity encoded data disposed at and adjacent the center of k-space; and
reconstructing the variable density sensitivity encoded data into an unfolded reconstructed image, the reconstructing including:
reconstructing the higher and lower density variable density sensitivity encoded data into a plurality of folded images, and
unfolding the folded images to form the unfolded image using the one or more regularization images.

9. The magnetic resonance imaging method as set forth in claim 8, wherein the acquiring of variable density sensitivity encoded data using a non-Cartesian trajectory includes:
acquiring a plurality of radial k-space sampling trajectories, the higher density portion of the variable density sensitivity encoded data being defined by a convergence of the plurality of radial k-space sampling trajectories at or near the center of k-space.

10. The magnetic resonance imaging method as set forth in claim 8, wherein the acquiring of variable density sensitivity encoded data using a non-Cartesian trajectory includes:
acquiring a spiral k-space sampling trajectory, the higher density portion of the variable density sensitivity encoded data being defined by a center region of the spiral k-space sampling trajectory.

11. The magnetic resonance imaging method as set forth in claim 10, wherein the spiral k-space sampling trajectory has one of a uniform spiral pitch and an expanding spiral pitch that increases with distance away from k-space center.

12. The magnetic resonance imaging method as set forth in claim 8, wherein the constructing of one or more regularization images includes:
reconstructing a plurality of low resolution images corresponding to radio frequency antennae used in the acquiring from the higher density portion of the variable density sensitivity encoded data, the regularization image used in the unfolding being constructed from the reconstructed low resolution images.

13. The magnetic resonance imaging method as set forth in claim 8, wherein the higher density portion of the variable density sensitivity encoded data is not undersampled.

14. A magnetic resonance imaging apparatus comprising:
a main magnet;
magnetic field gradient coils;
a plurality of radio frequency receive coils; and
a processor that performs the magnetic resonance imaging method of claim 8.

15. A magnetic resonance imaging apparatus comprising:
a plurality of radio frequency coils acquiring variable density sensitivity encoded data including:
a higher density portion disposed at or near the center of k-space acquired with a uniform k-space sampling density that is not undersampled, and
undersampled k-space data acquired away from the center of k-space using a k-space sampling density that decreases smoothly with distance away from the higher density portion;
a reconstruction processor that for each coil reconstructs:
a regularization image reconstructed from a higher density portion of the variable density sensitivity encoded data disposed at or near a center of k-space acquired by that coil, and
a folded image reconstructed from the variable density sensitivity encoded data acquired by that coil; and
an unfolding processor that unfolds the folded images, the unfolding being regularized by the regularization images.

16. The magnetic resonance imaging apparatus as set forth in claim 15, wherein the unfolding processor optimizes a penalty function including a weighted combination of:
an unfolding term indicative of fidelity of the unfolded image to the folded images, and
a regularization term indicative of fidelity of the unfolded image to the regularization images.

* * * * *